United States Patent
Allot et al.

(10) Patent No.: US 10,395,158 B2
(45) Date of Patent: Aug. 27, 2019

(54) METHOD FOR MAKING AN ANTI-CRACK ELECTRONIC DEVICE

(71) Applicant: GEMALTO SA, Meudon (FR)

(72) Inventors: Francis Allot, La Ciotat (FR); Sophie Lombardo, La Ciotat (FR); Mikko Lankinen, La Ciotat (FR); Youssiph Kamagate, La Giotat (FR); Frédéric Blachon, La Ciotat (FR)

(73) Assignee: GEMALTO SA, Meudon (FR)

( * ) Notice: Subject to any disclaimer, the term of this patent is extended or adjusted under 35 U.S.C. 154(b) by 0 days.

(21) Appl. No.: 14/896,094

(22) PCT Filed: Jun. 3, 2014

(86) PCT No.: PCT/EP2014/061473
§ 371 (c)(1),
(2) Date: Dec. 4, 2015

(87) PCT Pub. No.: WO2014/195308
PCT Pub. Date: Dec. 11, 2014

(65) Prior Publication Data
US 2016/0125284 A1    May 5, 2016

(30) Foreign Application Priority Data
Jun. 7, 2013  (EP) .................................. 13305764

(51) Int. Cl.
*G06K 19/077*   (2006.01)
(52) U.S. Cl.
CPC ..... *G06K 19/07728* (2013.01); *G06K 19/077* (2013.01); *G06K 19/0775* (2013.01);
(Continued)
(58) Field of Classification Search
CPC ......... G06K 19/077; G06K 19/077728; G06K 19/07747; G06K 19/0775
See application file for complete search history.

(56) References Cited

U.S. PATENT DOCUMENTS

| | | | |
|---|---|---|---|
| 5,578,796 A | * | 11/1996 | Bhatt .................. H01L 21/4807 174/252 |
| 5,598,032 A | | 1/1997 | Fidalgo |

(Continued)

FOREIGN PATENT DOCUMENTS

| | | |
|---|---|---|
| CN | 101203869 A | 6/2008 |
| FR | 2601477 A1 | 7/1986 |
| FR | 2 861 201 A1 | 4/2005 |

OTHER PUBLICATIONS

International Search Report (PCT/ISA/210) dated Oct. 30, 2014, by the European Patent Office as the International Searching Authority for International Application No. PCT/EP2014/061473.

(Continued)

*Primary Examiner* — Thien M Le
*Assistant Examiner* — Asifa Habib
(74) *Attorney, Agent, or Firm* — Buchanan Ingersoll & Rooney PC

(57) ABSTRACT

A method for making an intermediate electronic device, wherein said device is coated or is to be coated with a cover sheet or layer, the method comprising the step of forming a carrier-body comprising: a cavity provided in the carrier-body; an electric circuit comprising at least one electric interconnection area inside the cavity; an electronic module comprising at least one connection pad connecting said interconnection area and arranged in the cavity; a space or gap provided at the interface between the module and the carrier-body, substantially perpendicular to a main surface of the carrier-body, in communication with the surface of the carrier-body, and intended to be covered with a cover sheet or layer; the method is characterized in that a flexible or elastic material is arranged in the device so as to fill the space or gap between the module and the body-carrier or at least partially cover same.

10 Claims, 3 Drawing Sheets

(52) U.S. Cl.
CPC .......................... *G06K 19/07747* (2013.01);
*G06K 19/07722* (2013.01); *H01L 2224/48091*
(2013.01); *H01L 2224/48227* (2013.01); *H01L*
*2924/181* (2013.01)

(56) References Cited

U.S. PATENT DOCUMENTS

| | | | | |
|---|---|---|---|---|
| 5,608,262 | A * | 3/1997 | Degani | ............... H01L 23/13 257/723 |
| 5,889,654 | A * | 3/1999 | Pierson | ............ H01L 23/5388 257/720 |
| 5,975,420 | A | 11/1999 | Gogami et al. | |
| 6,320,753 | B1 * | 11/2001 | Launay | ............... G06K 19/077 174/255 |
| 6,568,600 | B1 * | 5/2003 | Carpier | ............ G06K 19/07749 235/487 |
| 6,716,675 | B2 * | 4/2004 | Waki | ............... H01L 21/56 257/E21.502 |
| 7,078,788 | B2 * | 7/2006 | Vu | ............... H01L 21/56 174/521 |
| 7,735,741 | B2 * | 6/2010 | Launay | ............ G06K 19/07745 235/487 |
| 7,992,790 | B2 | 8/2011 | Brunet | |
| 9,484,224 | B2 * | 11/2016 | Hsu | ............... H01L 23/49822 |
| 2004/0189625 | A1 * | 9/2004 | Sato | ............ G06K 19/07749 345/204 |
| 2006/0255157 | A1 | 11/2006 | Launay et al. | |
| 2009/0039168 | A1 * | 2/2009 | Sakurai | ............ G06K 19/07749 235/492 |
| 2015/0317554 | A1 * | 11/2015 | Le Garrec | ............ G06K 19/072 235/492 |
| 2016/0110639 | A1 * | 4/2016 | Finn | ............ G06K 19/07788 235/439 |

OTHER PUBLICATIONS

Written Opinion (PCT/ISA/237) dated Oct. 30, 2014, by the European Patent Office as the International Searching Authority for International Application No. PCT/EP2014/061473.

* cited by examiner

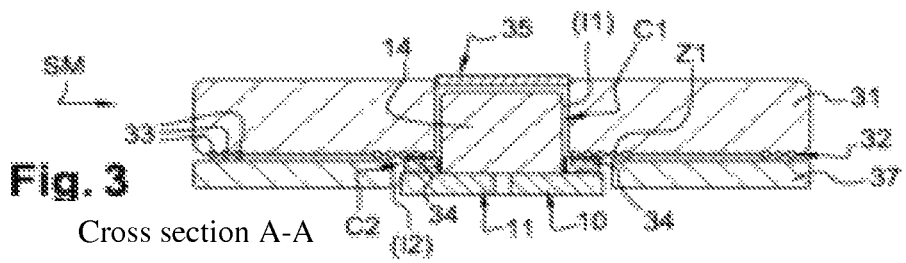
Fig. 3
Cross section A-A
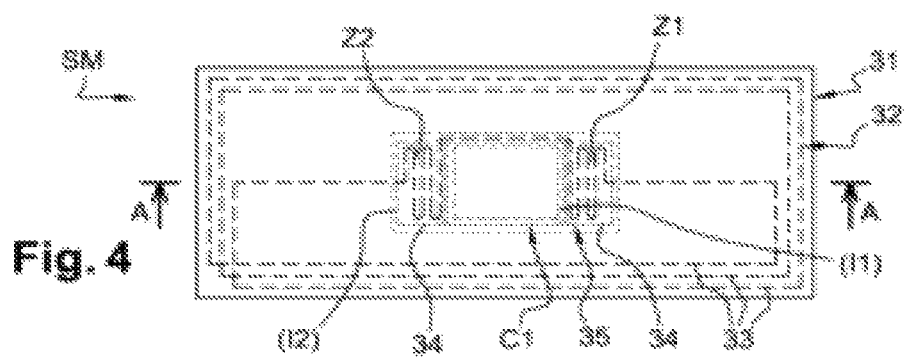
Fig. 4
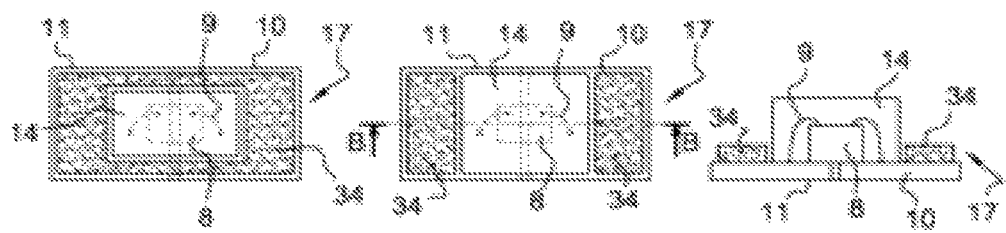
Fig. 6   Fig. 5A   Fig. 5B
Cross section B-B

METHOD FOR MAKING AN ANTI-CRACK ELECTRONIC DEVICE

FIELD OF THE INVENTION

The invention relates to a method for manufacturing a semi-finished (intermediate) and final device, comprising in particular a carrier body with a cavity integrating at least one connection area of an electrical/electronic circuit.

The invention relates in particular to the field of radio-frequency electronic carriers or devices such a radio-frequency chip cards or hybrid cards, radio-frequency tickets or labels, electronic passports, radio-frequency transponders, and inserts (or inlays) integrating or constituting such carriers.

These electronic carriers find an application in various chip-card fields, in particular for banking (EMV), identity, security, authentication, access, loyalty and passport applications.

Such electronic carriers may be in accordance in particular with the ISO/IEC 1443 standard or other radio-frequency standard, in particular NFC (Near Field Communication).

An electronic module may constitute or comprise conductive connection or interconnection pads carried or not, according to circumstances, by an insulating substrate.

PRIOR ART

The U.S. Pat. No. 5,598,032 describes a method for assembling a module intended to be connected to an antenna embedded in a hybrid chip card carrier body (of the contact and contactless type). Providing a cavity in the carrier body so as to make the connection areas of the antenna accessible for connection with the module when it is transferred into the cavity is known. Conductive interconnection elements of all kinds may connect connection pads of the module disposed outside the coating and the connection areas of the antenna.

Moreover, connecting this type of module to an antenna located in a hybrid card body of the contact and contactless type by means of an isotropic conductive material instead of the element 24 is known.

The patent application FR 2 861 201 describes a method for manufacturing a finished double-interface card. A module with external electrical contacts is inserted in a cavity in the finished card body and is connected to connection pads of an antenna by an isotropic adhesive. For inserting the module in the cavity, clearance is necessary between the edges of the module and the walls of the cavity. The clearance existing around the module is not covered or intended to be covered on top with a covering sheet.

Technical Problem

Currently, fragile layers of material used as a covering sheet in the chip card body may be damaged by cracks that arise and propagate in the region of the module.

Furthermore, connecting the module to a transponder antenna disposed in a carrier body is relatively slow.

Moreover, existing assemblies of a module in a card body may give rise to distortions of the chip carrier (the lead frame) causing additional stresses for the chip and weakening the radio-frequency functionality of the assembly.

SUMMARY OF THE INVENTION

The invention provides a flexible or elastic material that at least partially blocks or covers the spaces or gaps situated at the interface between the module and the carrier body and adjacent to the surface of the body.

By virtue of the invention, according to a preferred aspect, in a single connection operation and a single conductive material, the invention makes it possible to fulfill a connection function and a function of preventing the propagation of cracks after lamination.

A flexible or elastic material (at ambient temperature) disposed inside slots makes it possible to block or greatly reduce the variations in width of the slots; alternatively, by straddling the slots, the material absorbs variations/stresses, thus avoiding transmitting them to the cover sheets.

This is because, after transfer and hot pressing or lamination, the conductive material flows into the gaps. In the case of ACF, the connection takes place in a direction perpendicular to the principal plane of the carrier and there is no risk of short-circuit between the connection areas of the module.

According to another aspect, the invention provides a patch (a thin piece of flexible or elastic material in the form of a film or paste) that extends substantially around or vertically in line with the area of the attached module when the semi-finished radio-frequency insert is manufactured.

The flexible or elastic part may be in contact or not with the module or chip in order to avoid propagation of cracks in the final body, either by absorption of stresses or by mechanical decoupling of the module from the cover sheets.

The subject matter of the invention is a method for manufacturing an intermediate electronic device (SM), said device being covered or intended to be covered with a cover sheet or layer, said method comprising a step of forming a carrier body (31, 32) comprising:

- a cavity formed in the carrier body,
- an electrical circuit comprising at least one electrical interconnection area inside the cavity,
- an electronic module comprising at least one connection pad connecting said interconnection area, disposed in the cavity,
- a space or gap existing at the interface between the module and the carrier body, oriented substantially perpendicular to a principal surface of the carrier body, emerging on the surface of the carrier body and being intended to be covered with a cover sheet or layer.

The method is distinguished in that a flexible or elastic material is arranged in the device so as to at least partially fill or cover said space or gap between the module and the carrier body.

According to a preferred feature or implementation mode, the flexible material comprises a conductive connection material arranged and compressed in the device so as to connect the module to the circuit and to flow into said space or gap in order to at least partially fill it.

According to other features or implementation modes of the device:

- the conductive material is of the anisotropic type;
- the anisotropic material surrounds the module;
- the device comprises a patch (35) made from flexible or elastic material covering the interface;
- the device comprises at least one cover sheet (38) on top of or underneath said patch.

Another subject matter of the invention is a device corresponding to the method.

BRIEF DESCRIPTION OF THE FIGURES

FIGS. 3 and 4 illustrate a step of a first embodiment of the invention respectively in plan view and in cross section A-A in FIG. 4;

FIGS. 5A, 5B and 6 illustrate a module that can be used by the invention with two different distributions of the conductive glue on the module;

DESCRIPTION

Figure 1:
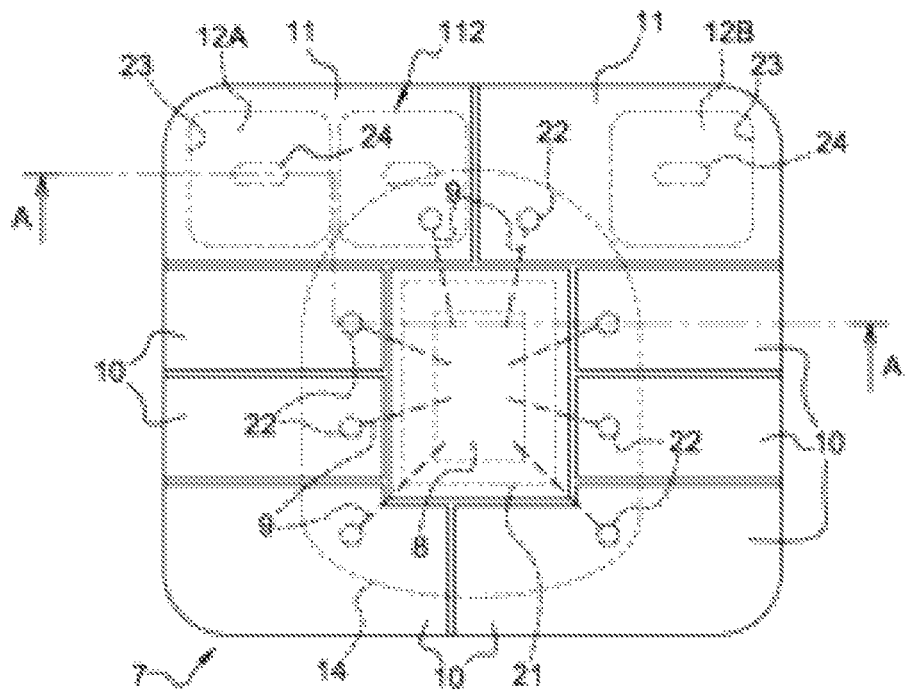
FIGS. 1 and 2 illustrate an example of a chip card module of a hybrid integrated circuit of the prior art.
Figure 2:
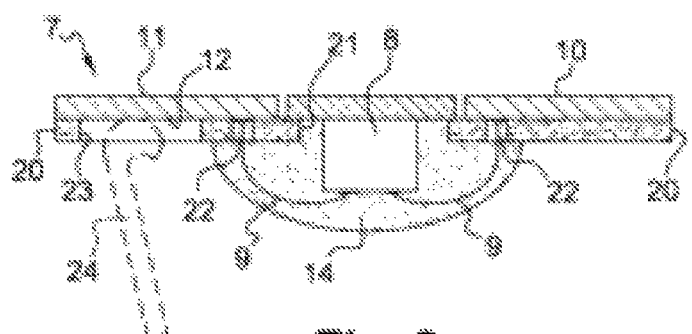

FIGS. 1 and 2 illustrate an example of a chip card module 7 of a hybrid integrated circuit of the prior art. The module 7 comprises contact pads 10, 11 on a dielectric or insulating carrier 20, in particular of the laminated lead frame type, at least one integrated circuit chip 8 attached to the carrier 20 or here to a contact or contactless metal pad. The contact pads are intended to connect a chip card reader connector.

The module also comprises connections 9 for in particular connecting contact pads by soldered wires, by conductive glue or other, an electronic chip 8 (here of the hybrid type) which may be turned over (flip-chip) or not; it comprises a coating 14 on the chip and/or its connections by means of a protective material such as a resin (glob-top).

The connections 9 may connect the contact pads through orifices 22 formed in the insulating support.

In relation to FIGS. 3 to 9, a method for manufacturing an electronic device SM, which may be temporary or definitive, is described; the device (SM) comprises, according to a first embodiment/implementation of the invention, an assembly step.

The assembly of this example comprises a carrier body (31, 32) provided with a cavity (C1, C2) and an electrical circuit (32) comprising at least one electrical interconnection area (Z1, Z2) inside the cavity. The device also comprises, in the cavity, an electronic/electrical module (17) comprising at least one connection pad (10, 11) and having an interface or delimitation (I1, I2) between the module and the wall of the cavity; it also comprises a flexible conductive material (34) for connection said connection pad of the module to said interconnection area (Z1, Z2).

The interface between the module and the carrier body here defines two gaps I1, I2, oriented perpendicular to the opposite principal surfaces of the carrier body and emerging from the carrier body.

The carrier body may be obtained for example by moulding or superimposition of sheets. In the example, the device is a purely contactless (radio-frequency) card having as an electrical circuit a radio-frequency antenna 32 connected to a radio-frequency module 17. However, the device may alternatively be an electronic passport, a radio-frequency (or NFC) key, a printed circuit, a radio-frequency reader, an RFID label or any electronic object.

The electrical and/or electronic circuit may be chosen from or comprise in particular an antenna, a display unit, a sensor, a keypad, a capacitor, a switch, an electrical and/or electronic component, an energy-supply battery, a printed circuit (PCB), etc.

In the example in FIG. 3, the circuit is a radio-frequency antenna 32 composed here of turns 33 formed on a substrate 31 by any known means, in particular by screen printing, conductive-material jet, electrode deposition technique or etching. In the example, the antenna is a wire coated by ultrasonic technique on the principal surface of the substrate 1 in particular with a known plastics (ABS, PC, PET) or fibrous material. For other radio-frequency frequencies (in particular UHF), the antenna may have a form different from flat turns. The connection areas of the antennas are formed by zigzags (or close-together alternations) of conductive wires.

The antenna comprises connection or interconnection areas Z1, Z2 spaced apart by a distance corresponding to the two connection pads 10, 11 of the radio-frequency module (or connection pins of the chip).

In the case where, as in the example, the pads consist of conductive wires covered with insulator, the latter may be eliminated at the point of the connection by any known means, in particular mechanical, machining or by laser, or chemical or thermal attacks.

The substrate 31 is here assembled with a compensation sheet 37 covering the antenna. This thickness compensation sheet 37 comprises a perforation or cavity C2 centered on a perforation or cavity C1 of the substrate formed between the connection areas of the antenna.

Moreover, the method used a radio-frequency module comprising a radio-frequency chip (which may alternatively be hybrid).

The module comprises here two connection pads 10, 11 (without dielectric support) connected to the chip 8 by a connection, in particular wired 9, and a coating 14 as before.

According to one feature of the invention, the conductive material is arranged and compressed in the device so as to flow into the interface and at least partially fill the interface (I2).

In the example, a conductive material (or conductive matter) 34 is placed between the connection areas of the antenna and that of the module (or pins of the chip) before making the connection by transfer of the module.

According to one advantage of the invention, the conductive material has the property of being more flexible than the covering sheets at the temperature of use of the electronic product (in particular between −15° C. and 60° C.).

However, preferably, it is possible to use an anisotropic material, in the form of a film (ACF) or past (ACP) or a flexible conductive resin (the flexibility preferably being greater than that of the cover sheets) in the same environment in particular of temperature and pressure.

For example, in FIGS. 5A, 5B, 6, the conductive material 34 may be disposed (arranged) or laminated on the connection pads of the module (or chip). In FIGS. 5A, 5B, the material is disposed on each connection pad. In FIG. 6, the material 34, in the form of a ring, surrounds the coating. The thickness (or volume) of the conductive material is calculated so as to allow flow of the material into the gaps surrounding the module after final assembly with the body of the device.

Then the module 17 is attached against the antenna, pressed and heated at least over this contact area in order to establish the connection with the contact pads of the antenna, the compression and flow of the conductive material into the gaps (I1 or even I2) surrounding the module, situated at the interface between the module and the body of the device and oriented substantially perpendicular to the principal surface of the carrier body.

Alternatively, the conductive material 34 may be applied directly to the connection areas Z1, Z2 of the antenna; next the module (or chip) is attached against the antenna, and pressed and heated at least over this connection area.

For this step, two following options are possible. The dimensions of the conductive film (or paste, electrically conductive material) may be adjusted to the connection areas of the antenna and/or module. Alternatively, the dimensions of the electrically conductive film may be adjusted to the dimensions of the module (or chip).

Secondarily also, before hot pressing, it is possible to dispose a patch or piece of thermosetting elastic material 35 against the rear of the module, here against the coating 14. This patch covers, in the example, the entire surface of the cavity C1 and the gap I1 existing between the cavity and the coating 14. This patch is intended to absorb stresses that may arise at the interface of the module with the carrier body (or substrate) and stop any propagations of cracks to any cover sheet (or layer of material) covering the carrier body 31.

Hot pressing may be carried out during the transfer of the module but it is preferable carried out subsequently during hot lamination of the device once assembled with cover plates or sheets and another anti-crack patch or piece as explained subsequently. Preferably, the assembly takes place on large plates or sheets comprising a plurality of electrical/electronic circuit modules and antennas. The substrate 31 may also be in the form of a continuous strip, the final device then being extracted by cutting from a substrate comprising a plurality of devices formed together.

Figure 7:
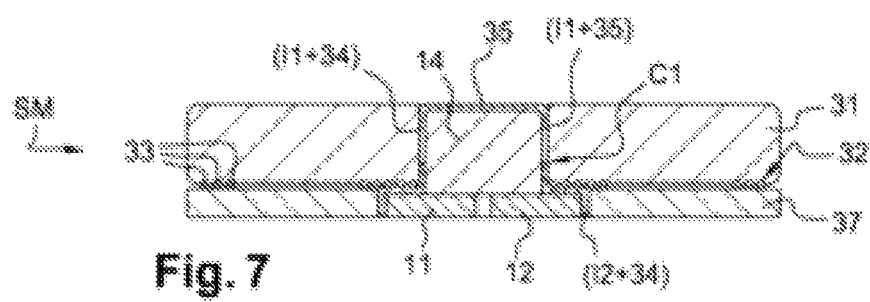
FIG. 7 illustrates the device of FIG. 3 after hot pressing.

In FIG. 7, the semi-finished device SM is obtained by hot lamination. The gaps (I1, I2) present between the module 17 and the internal wall of the cavities C1, C2 are at least partially (or completely) filled with the elastic conductive material 34 that flowed therein during lamination.

Thus these gaps, responsible for generating cracks on the cover sheets covering the body 31 and/or 37, may be at least partially blocked with the same conductive material used for the electrical connection of the module.

According to a preferred aspect, the operation of connecting the module to the antenna and the operation of at least partial filling in of the gaps surrounding the module may advantageously be done by hot lamination of the whole.

Moreover, the gap I1 at the rear of the module may, where applicable, also be filled in with a rear patch 35 that has also flowed therein.

The rear surface of the coating may also comprise the elastic material 35 for absorbing compressions of the module towards the rear surface of the substrate (occurring in particular during bending/twisting of the final device).

Thus the module may be at least partially surrounded by or covered with elastic material absorbing the mechanical stresses and preventing propagation of cracks to the cover sheets.

Figure 8:
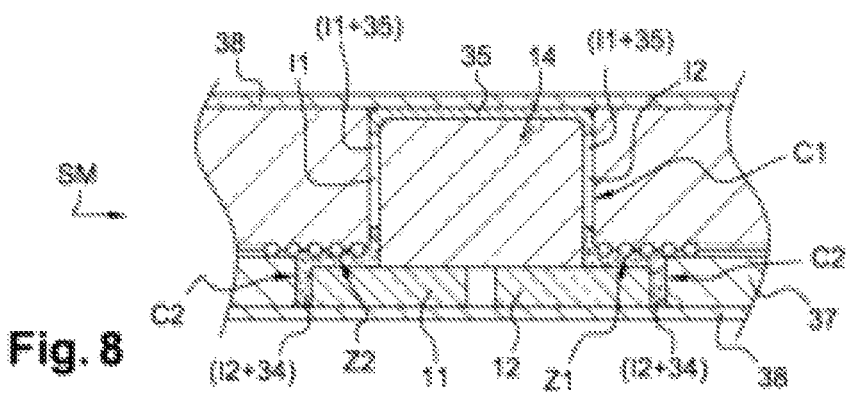
FIG. 8 illustrates the same device as that of FIG. 7 (in larger plan view) with cover sheets added.

In FIG. 8, the invention provides for a construction similar to the previous figure but with in addition cover sheets laminated on the device SM on either side of the device.

Figure 9:
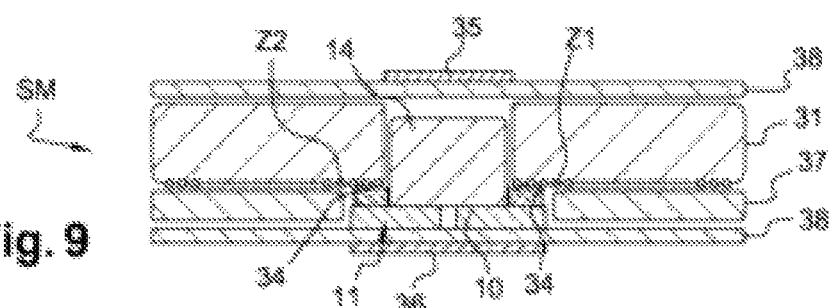
FIGS. 9 and 10 illustrate a second and third embodiment of the invention.

In FIG. 9, the invention provides a construction similar to FIG. 8, except that the elastic (absorbent) patch 35 is disposed outside the cover sheet covering the substrate 31 on the coating side.

Where applicable, this second embodiment may comprise another elastic thermosetting patch 36 vertically in line with the contact pads of the module or the cavity C2 of the compensation sheet.

Figure 10:
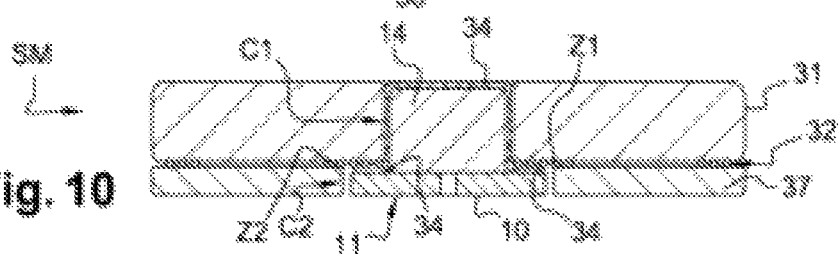

In FIG. 10, the construction is similar to that of FIG. 3 except that the conductive material 34 and rear patch 35 are formed from the same piece.

Two methods may be envisaged. The first consists of covering the module with a cap or strip of conductive material 34 covering the contact pads and the rear of the coating before transferring the module thus covered into the cavities C1 and C2. The second may consist of placing a portion of the sheet or piece in the cavity C2 and next transferring thereon the module, which deforms the piece 34 as the module is inserted in the cavity C1.

Thus, with the same conductive material 34, the module is connected to the antenna and the gap situated between the coating and the cavity is at least partly filled in.

This conductive material also fulfills the function of preventing propagation or cracks from the patch 35 to the rear of the module.

The invention claimed is:

1. A method for manufacturing an intermediate electronic-device for a device having an electronic module covered with a cover sheet or layer, said method comprising a step of forming a carrier body comprising:
   a cavity formed in the carrier body and extending through opposed outer surfaces of the carrier body,
   an electrical circuit inside the cavity, said electrical circuit comprising a conductive path and at least one electrical interconnection area electrically connected to said conductive path,
   an electronic module comprising a protective coating and at least one connection pad connecting said interconnection area, said electronic module, including said at least one connection pad, being disposed in the cavity,
   a cover sheet or layer disposed outside the cavity and covering said electronic module from outside the cavity, and
   a space or gap existing at the interface between the module and the cavity formed in the carrier body,
   wherein the space or gap is at least partially filled by a conductive material arranged in the device in contact with the at least one electrical interconnection area and the at least one connection pad.

2. A method according to claim 1, wherein the conductive material is arranged and compressed in the device so as to connect the module to the circuit and to flow into said space or gap in order to at least partially fill it.

3. A method according to claim 2, wherein the conductive material is of the anisotropic type.

4. A method according to claim 3, wherein the anisotropic material surrounds the module.

5. A method according to claim 4, wherein the anisotropic material comprises a patch made from flexible or elastic material covering the interface.

6. A method according to claim 5, wherein the anisotropic material comprises at least one cover sheet on top of or below said patch or the space or gap.

7. An intermediate electronic device for a device having an electronic module covered by a cover sheet or layer, comprising:
   a carrier body;
   a cavity formed in the carrier body and extending through opposed outer surfaces of the carrier body;
   an electrical circuit inside the cavity, said electrical circuit comprising a conductive path and at least one electrical interconnection area electrically connected to said conductive path,
   an electronic module comprising a protective coating and at least one connection pad connecting said interconnection area, said electronic module, including said at least one connection pad, being disposed in the cavity;
   a cover sheet or layer disposed outside the cavity and covering said electronic module from outside the cavity;
   a space or gap existing at the interface between the module and the cavity formed in the carrier body, and
   wherein the space or gap is at least partially filled by a conductive material arranged in the device in contact with the at least one electrical interconnection area and the at least one connection pad.

8. A device according to claim 7, wherein the conductive material is arranged and compressed in the device so as to connect the module to the circuit and to flow into said space or gap in order to fill it at least partially.

9. A device according to claim 8, wherein the conductive material is anisotropic.

10. A device according to claim 7 wherein said cover sheet or layer covers said space or gap.

* * * * *